US007012645B1

(12) United States Patent
Tsai

(10) Patent No.: US 7,012,645 B1
(45) Date of Patent: Mar. 14, 2006

(54) IMAGE SENSOR WITH P-TYPE CIRCUITRY AND N-TYPE PHOTOSENSOR

(75) Inventor: Richard H. Tsai, Alhambra, CA (US)

(73) Assignee: Micron Technology, Inc., Boise, ID (US)

( * ) Notice: Subject to any disclaimer, the term of this patent is extended or adjusted under 35 U.S.C. 154(b) by 785 days.

(21) Appl. No.: 09/648,403

(22) Filed: Aug. 24, 2000

Related U.S. Application Data

(60) Provisional application No. 60/151,219, filed on Aug. 26, 1999.

(51) Int. Cl.
H04N 3/16 (2006.01)

(52) U.S. Cl. ...................................................... 348/308

(58) Field of Classification Search ............. 250/208.1, 250/370.08, 332, 338.4, 214 R, 214 A, 214 DC; 348/294, 296, 297, 300–304, 307–310; 257/213, 257/229, 231, 233, 288, 290, 291, 292
See application file for complete search history.

(56) References Cited

U.S. PATENT DOCUMENTS 5,372,955 A * 12/1994 Yang .......................... 438/294
5,757,008 A * 5/1998 Akagawa et al. ...... 250/370.08
5,818,052 A * 10/1998 Elabd .................... 250/370.09
5,881,184 A * 3/1999 Guidash ..................... 382/321
5,917,547 A * 6/1999 Merrill et al. .............. 348/241
6,049,111 A * 4/2000 Higuchi et al. ............. 257/355
6,175,383 B1 * 1/2001 Yadid-Pecht et al. ....... 348/302
6,252,218 B1 * 6/2001 Chou ...................... 250/208.1
2002/0134911 A1 * 9/2002 Zarnowski et al. ...... 250/208.1

* cited by examiner

Primary Examiner—Wendy R. Garber

Assistant Examiner—Jason Whipkey

(74) Attorney, Agent, or Firm—Dickstein Shapiro Morin & Oshinsky LLP

(57) ABSTRACT

A pixel sensor that provides image sensing under radiation or space environment is disclosed. The pixel sensor includes a readout circuit and a first reset circuit. The readout circuit converts optical image signals to electronic signals, and includes p-type transistors and an n-type photosensitive element. The first reset circuit is configured to provide a reset level for a pixel output, and also includes p-type transistors. The use of p-type transistors and n-type photosensitive element provides radiation hardness without any radiation protective enclosure.

33 Claims, 8 Drawing Sheets

FIG. 8A
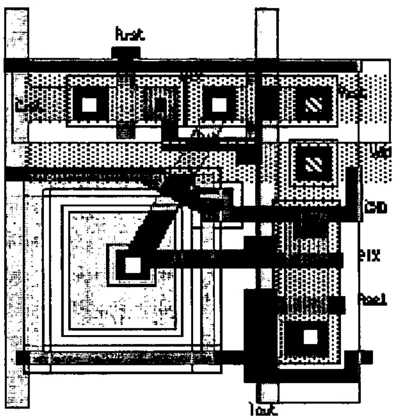
FIG. 8B
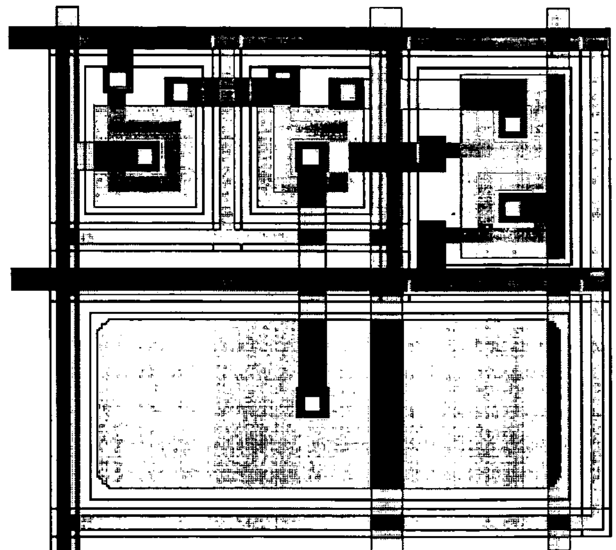
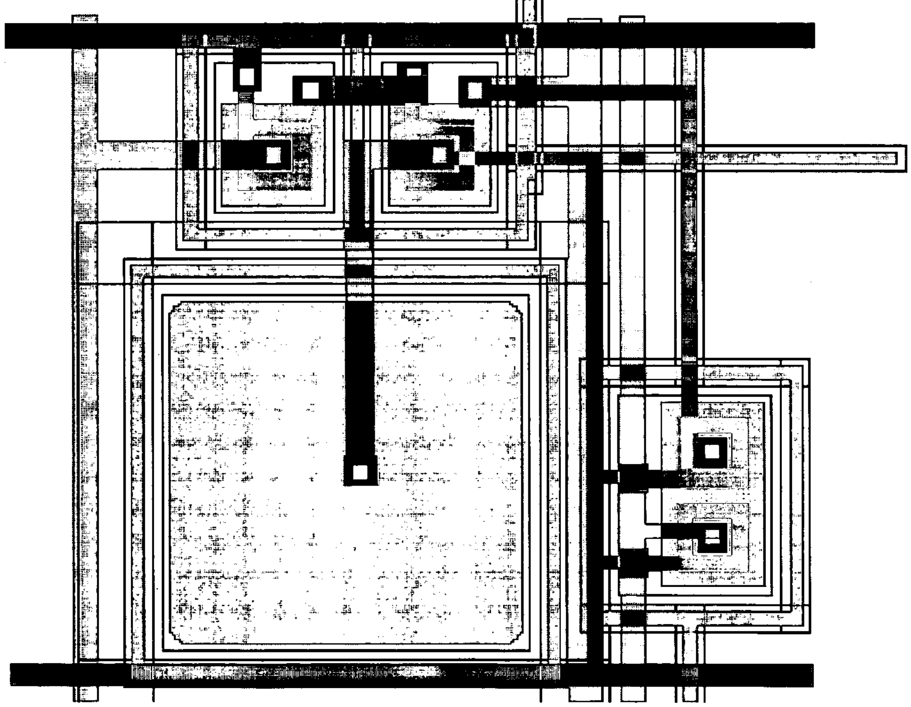
FIG. 8C

IMAGE SENSOR WITH P-TYPE CIRCUITRY AND N-TYPE PHOTOSENSOR

CROSS REFERENCE TO RELATED APPLICATION

This application claims the benefit of the priority of U.S. Provisional Application No. 60/151,219, filed on Aug. 26, 1999, and entitled P-Type Reset/Readout Circuitry for Radiation Hard APS.

BACKGROUND

The present disclosure generally relates to solid-state image sensors, and more specifically, to radiation hard active pixel sensors.

Charge coupled devices (CCD) have been used to process electronic image data. However, recent trend toward lower power consumption and greater system integration have spurred efforts to utilize existing sub-micron CMOS technology for electronic imaging applications.

Active pixel sensors (APS) are solid-state imagers where each pixel contains a photo-sensor, a photon to voltage converter, and a reset transistor. The APS detects image signals through a transistor switching rather than charge coupling. However, solid-state imagers may require a protective enclosure in order to operate under radiation or space environment.

SUMMARY

In recognition of the above-described difficulties, the inventor recognized the need for providing a compact, radiation-hard active pixel sensor. Thus, the present disclosure discloses a pixel sensor that provides image sensing under radiation or space environment.

The pixel sensor includes a readout circuit and a first reset circuit. The readout circuit converts optical image signals to electronic signals, and includes p-type transistors and an n-type photosensitive element. The first reset circuit is configured to provide a reset level for a pixel output, and also includes p-type transistors. The use of p-type transistors and n-type photosensitive element provides radiation hardness without any radiation protective enclosure.

The present disclosure further includes a CMOS image sensor system, which includes an array of active pixel sensors, a control circuit, and a column readout circuit. Each pixel sensor of the array includes a pixel readout circuit and a first reset circuit. The pixel readout circuit converts optical image signals to electronic signals, and includes p-type transistors and an n-type photosensitive element. The first reset circuit is configured to provide a reset level for a pixel output, and also includes p-type transistors. The control circuit provides timing and control signals to enable read out of data stored in the array of active pixel sensors. The column readout circuit receives and processes the data stored in the array of active pixel sensors.

BRIEF DESCRIPTION OF THE DRAWINGS

Different aspects of the disclosure will be described in reference to the accompanying drawings wherein:

FIG. 8A illustrates one embodiment of a typical size of a pixel sensor in accordance with the present system;

FIGS. 8B and 8C show minimum sizes of conventional pixel sensors, one having a square photodiode and another having a rectangular photodiode.

DETAILED DESCRIPTION

Figure 1:
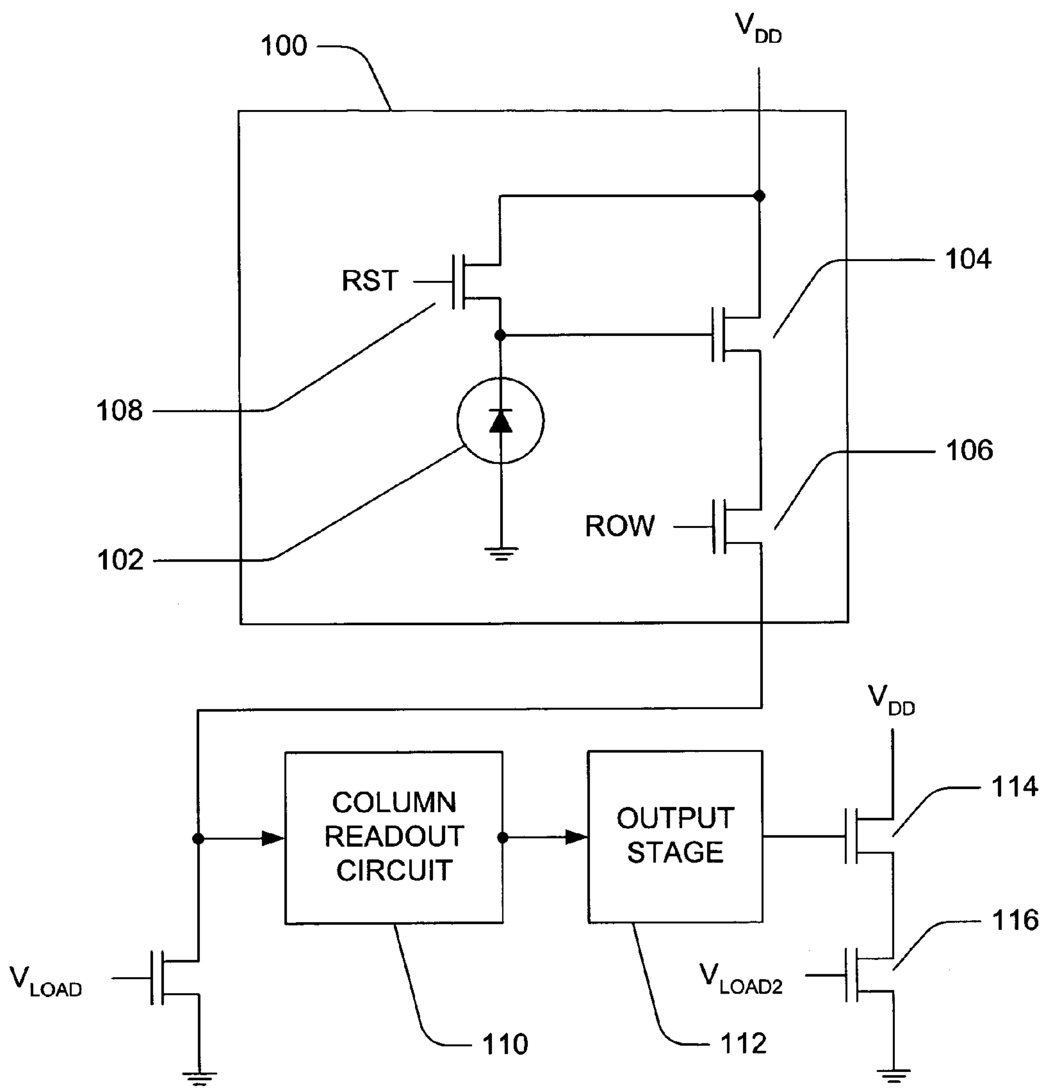
FIG. 1 illustrates a conventional active pixel sensor and its associated readout circuitry.

A conventional active pixel sensor and its associated readout circuitry are illustrated in FIG. 1. Each pixel 100 of the active pixel sensor may include a photosensitive element 102 buffered by a source-follower transistor 104 and a row selection switch, which can be implemented by a transistor 106. A signal "ROW" is applied to the gate of the row selection transistor 106 to enable a particular row of pixels. In some embodiments, the element 102 includes a photogate with a floating diffusion output separated by a transfer gate. In other embodiments, the photosensitive element 102 includes a photodiode. Each pixel 100 also includes a reset switch that can be implemented as a transistor 108 controlled by a signal "RST" applied to its gate.

FIG. 1 further includes a column readout circuit 110 and an output stage 112. The column readout circuit 110 may include sample and hold circuits to sample both the reset and signal levels to reduce reset noise associated with the pixel as well as noise associated with the source-follower transistor 104. Multiple column readout circuits 110 are coupled to the output stage 112, which may include switched integrators. The output of the output stage 112 may be coupled to a source-follower transistor 114 and a load transistor 116. The illustrated conventional design of the active pixel sensor is often implemented with n-channel MOSFET transistors and a p-type photodiode as a photosensitive element 102. However, the above-described active pixel sensor design often requires a protective enclosure to operate under radiation or space environment.

The inventor recognized that p-channel MOSFET transistors provide significantly better protection against radiation than n-channel MOSFET transistors. A p-channel MOSFET transistor design also uses smaller silicon area. Further, a need for a protective enclosure may not be necessary with p-channel transistor design. However, traditional p-type photodiodes often suffer from low quantum efficiency. The quantum efficiency provides a measure of conversion efficiency between photons picked up by a photosensitive element and a number of electrons converted from the photons. Further, possible latch-up problems, when reset level exceeds $V_{DD}$ due to the charge injection of a switch, caused the prior designs to prefer n-channel transistors.

Figure 2:
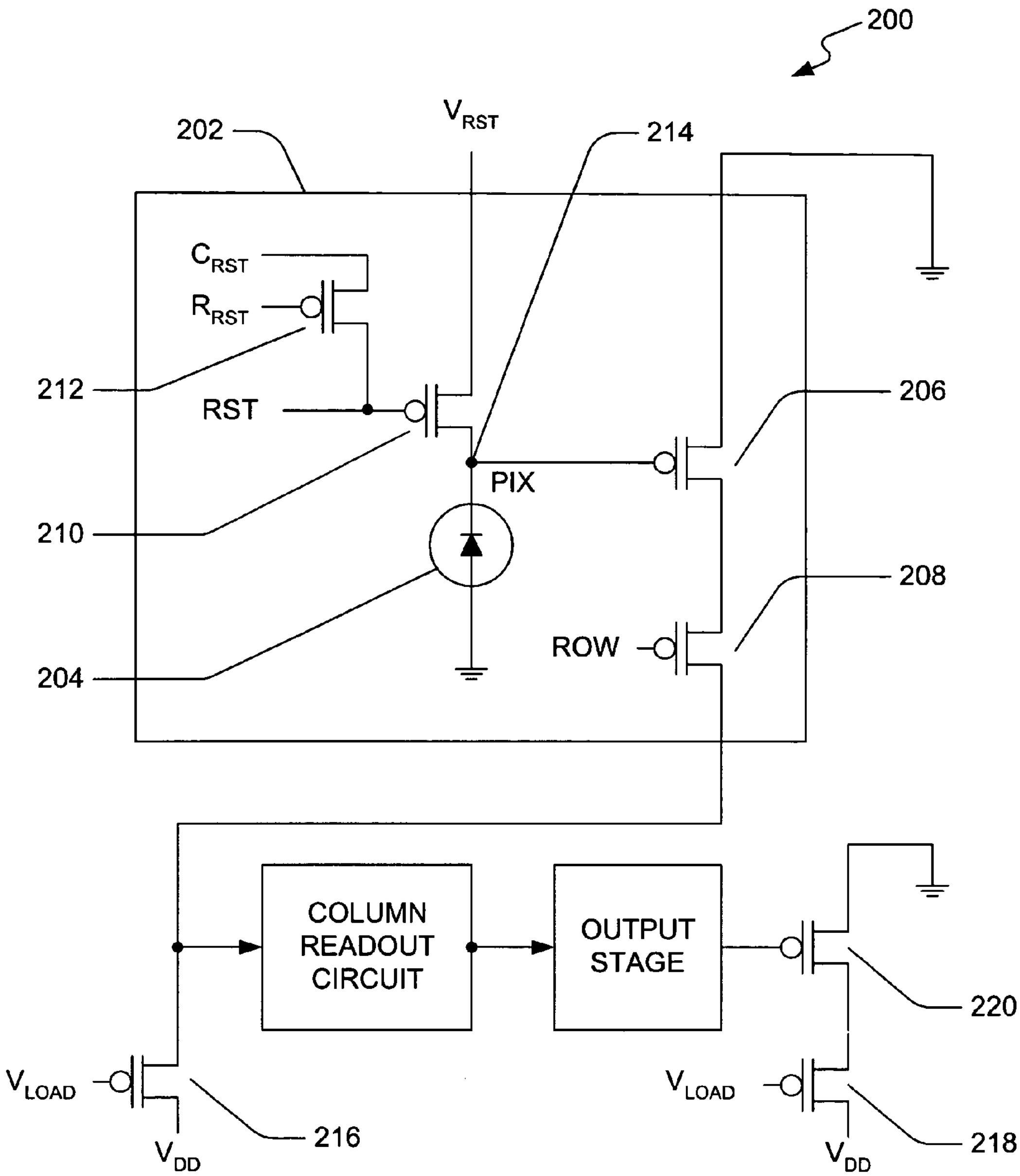
FIG. 2 illustrates an embodiment of the present system configured to provide compact, radiation-hard active pixel sensor.

FIG. 2 illustrates an embodiment of the present system 200 configured to provide a compact, radiation-hard active pixel sensor. The system also produces a large output signal range that may be important for individual pixel reset application. In the illustrated embodiment, the active pixel sensor and its associated readout circuitry are implemented with p-channel transistors and an n-type photodiode as a photosensitive element 204. In one embodiment, the transistors are MOSFET transistors.

Figure 3:
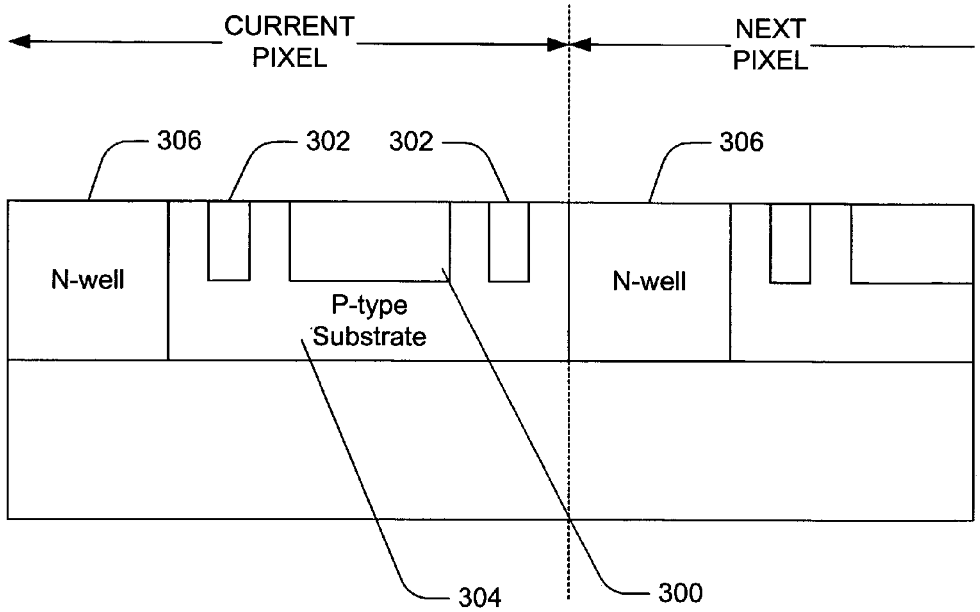
FIG. 3 shows a cross-section view of the pixel sensor.

The p-channel MOSFET transistor design may provide radiation hardness without the need for a protective enclosure. In addition, the n-type photodiode provides better quantum efficiency than p-type photodiodes. Further, as illustrated in FIG. 3, the n-type photodiode configuration allows formation of p+guard rings connected to the ground around the n-type photodiode. The grounded guard rings may substantially reduce leakage current and prevent any latch-ups.

In the illustrated embodiment of FIG. 2, each pixel 202 of the active pixel sensor 200 may include an n-type photosensitive element 204 buffered by a p-channel MOSFET source-follower transistor 206 and a row selection switch which can be implemented by a p-channel MOSFET transistor 208. A signal "ROW" is applied to the gate of the row selection transistor 208 to enable a particular row of pixels. Each pixel 202 also includes a reset switch that can be implemented as a p-channel MOSFET transistor 210 controlled by a signal "RST" applied to its gate. An optional p-channel reset transistor 212 is provided for individual pixel reset application. This reset transistor 212 may allow a pixel-by-pixel reset operation instead of the row-by-row operation.

When $R_{RST}$ is at logic low and $C_{RST}$ at logic high, the reset switch 210 is turned off. However, the n-type well 306 (see FIG. 3) connected to $V_{DD}$ allows the leakage current of a small photodiode (drain of the reset transistor) to charge the node 214 higher while the leakage current of an n-type reset transistor discharges the node 214 lower as the n-type photodiode. Thus, the p-channel transistors provide smaller leakage current than the n-channel transistors.

However, when $R_{RST}$ is at logic low and $C_{RST}$ at logic low, the reset switch 210 may be turned on by a p-channel threshold voltage ($V_{thp}$) at the gate of the reset switch 210. The above-described configuration resets the node 214 to $V_{RST}$, which is equal to $V_{DD}$ minus a small voltage of about 0.7 volts ($V_{thp}$). This reset voltage ($V_{RST}$) further prevents any latch-up problems caused by a reset level exceeding $V_{DD}$ due to the charge injection of the reset switch.

The reset voltage ($V_{RST}$) needs to stay below the supply voltage ($V_{DD}$) to keep the p-channel source follower transistor 206 in the linear region. By keeping the source follower 206 in the linear region, the active pixel sensor has hard reset levels such as small fixed pattern noise and uniform reset levels.

The p-channel transistor design of the active pixel sensor 200 also includes p-channel load transistors 216, 218 and a p-channel output source-follower 220.

Referring to FIG. 3, the n-type photodiode 300 is guarded by a pair of p+ guard rings 302 connected to the ground. The photodiode 300 and the guard rings 302 are provided over a p-type substrate 304. N-type wells 306 on either side are connected to $V_{DD}$. The wells 306 are configured to prevent crosstalk between pixels.

A simulation result with an active pixel sensor design as described above is shown in FIG. 4. The result shows that when a row is selected, the output follows the voltage level of PIX node 214. When $C_{RST}$ (along with $R_{RST}$) is set to logic low, PIX node 214 is reset to $V_{RST}$. Thus, the active pixel sensor of the present system provides large output swing and hard reset level. As a result, the dynamic range of the sensor increases.

Figure 5:
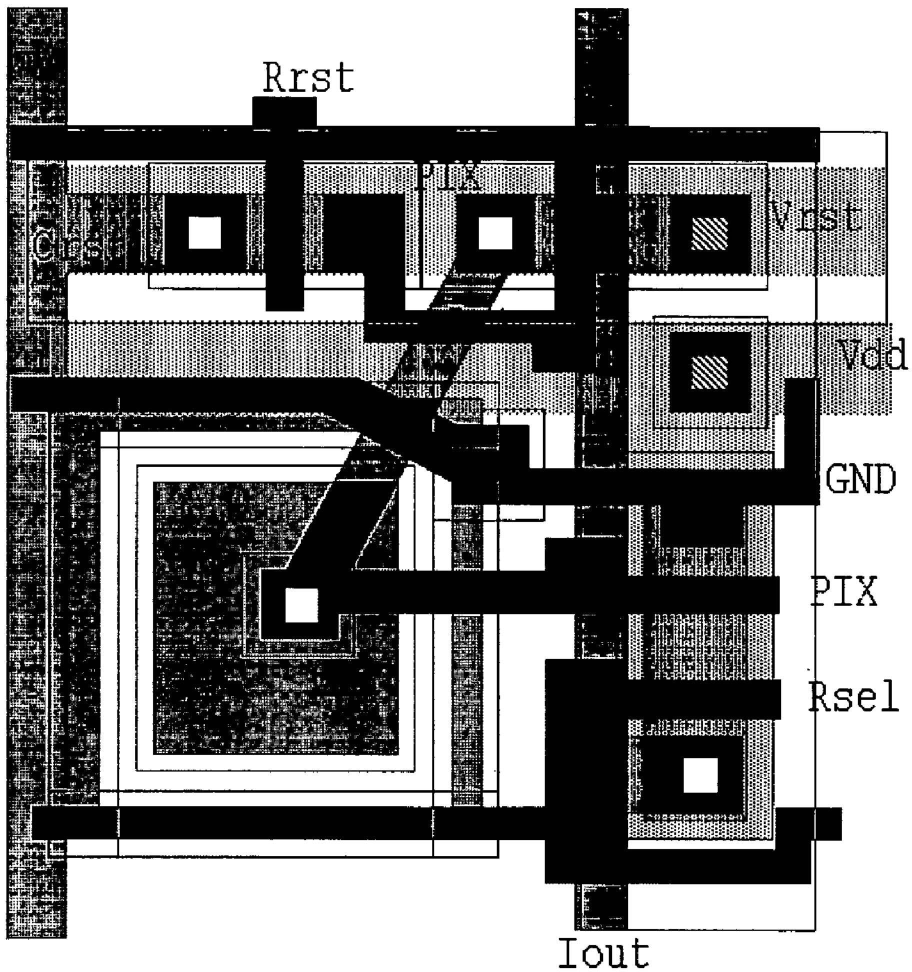
FIG. 5 shows one implementation of a layout design using p-channel transistors and a square or a rectangular n-type photodiode.
Figure 6:
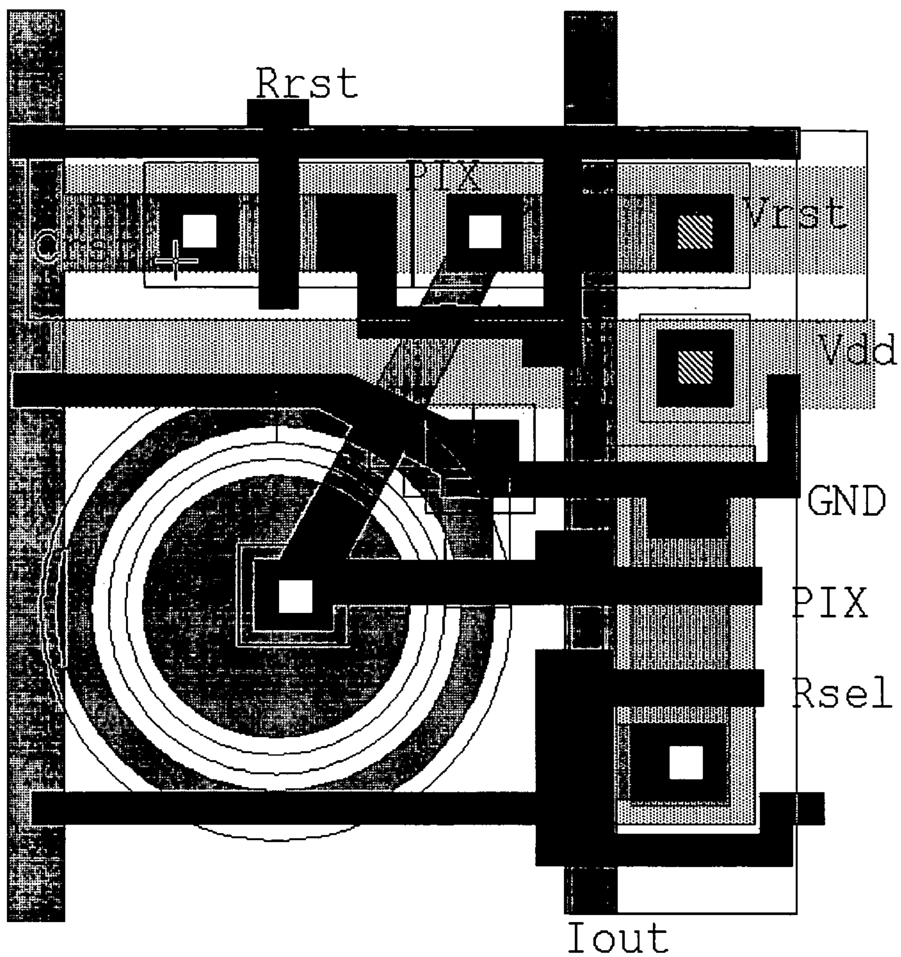
FIG. 6 shows one implementation of a layout design using p-channel transistors and a circular photodiode.
Figure 7:
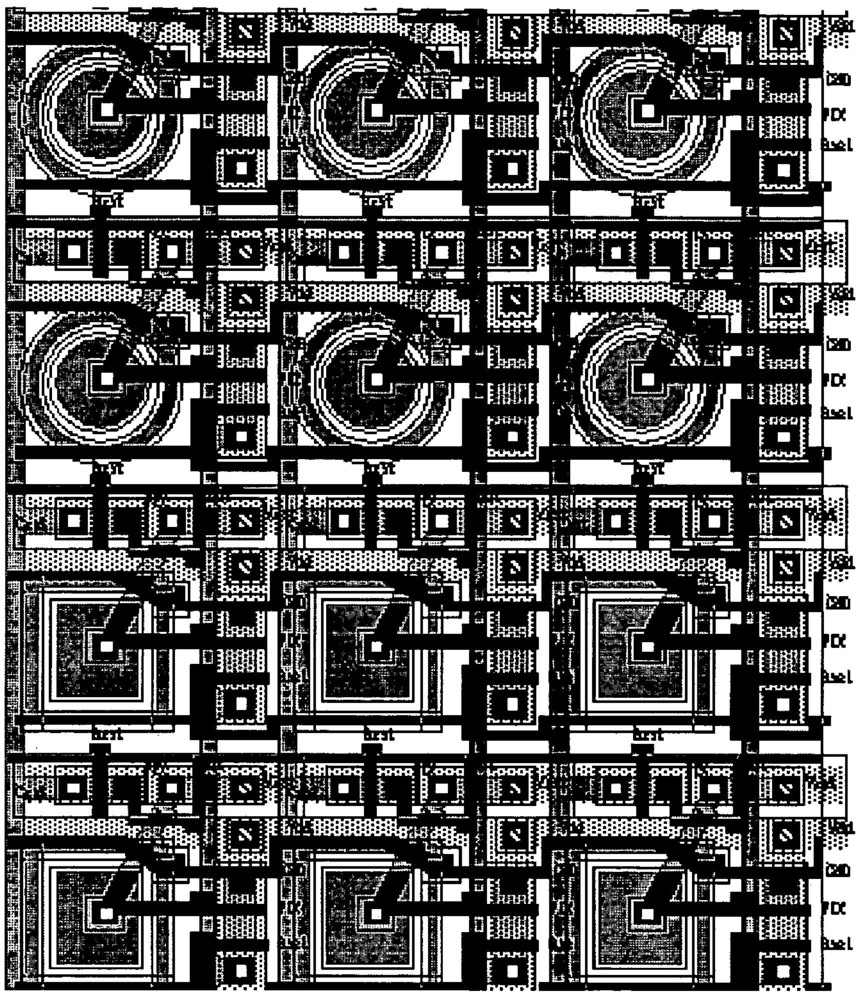
FIG. 7 shows a pixel array having a mixture of p-channel transistors and an n-type photodiode.

FIGS. 5 through 7 illustrate different layout implementations of the active pixel sensor using the design described above. FIG. 5 shows one implementation of a layout design using p-channel transistors and a square or a rectangular n-type photodiode. FIG. 6 shows one implementation of a layout design using p-channel transistors and a circular photodiode. FIG. 7 shows a pixel array having a mixture of above-described pixel designs. This pixel array may be used in an active pixel sensor design to provide image sensing under radiation environment.

FIGS. 8A to 8C show comparison of areal density between the p-channel transistor/n-type photodiode design and conventional n-channel transistor designs.

FIG. 8A illustrates one embodiment of a typical size of a pixel sensor in accordance with the present system. The pixel sensor has an n-channel square photodiode. The minimum size of this pixel sensor is measured to be approximately $(14\ \mu m)^2$.

FIGS. 8B and 8C show minimum sizes of conventional pixel sensors, one having a square photodiode and another having a rectangular photodiode. The rectangular photodiode design requires minimum size of approximately $(21\ \mu m)^2$ while the square photodiode requires minimum size of approximately $(28\ \mu m)^2$. Thus, it is shown that pixel sensor design of the present system requires less than half the size of the conventional design. Further, the conventional design would also require a bulky enclosure to protect the pixel array from the radiation.

Figure 9:
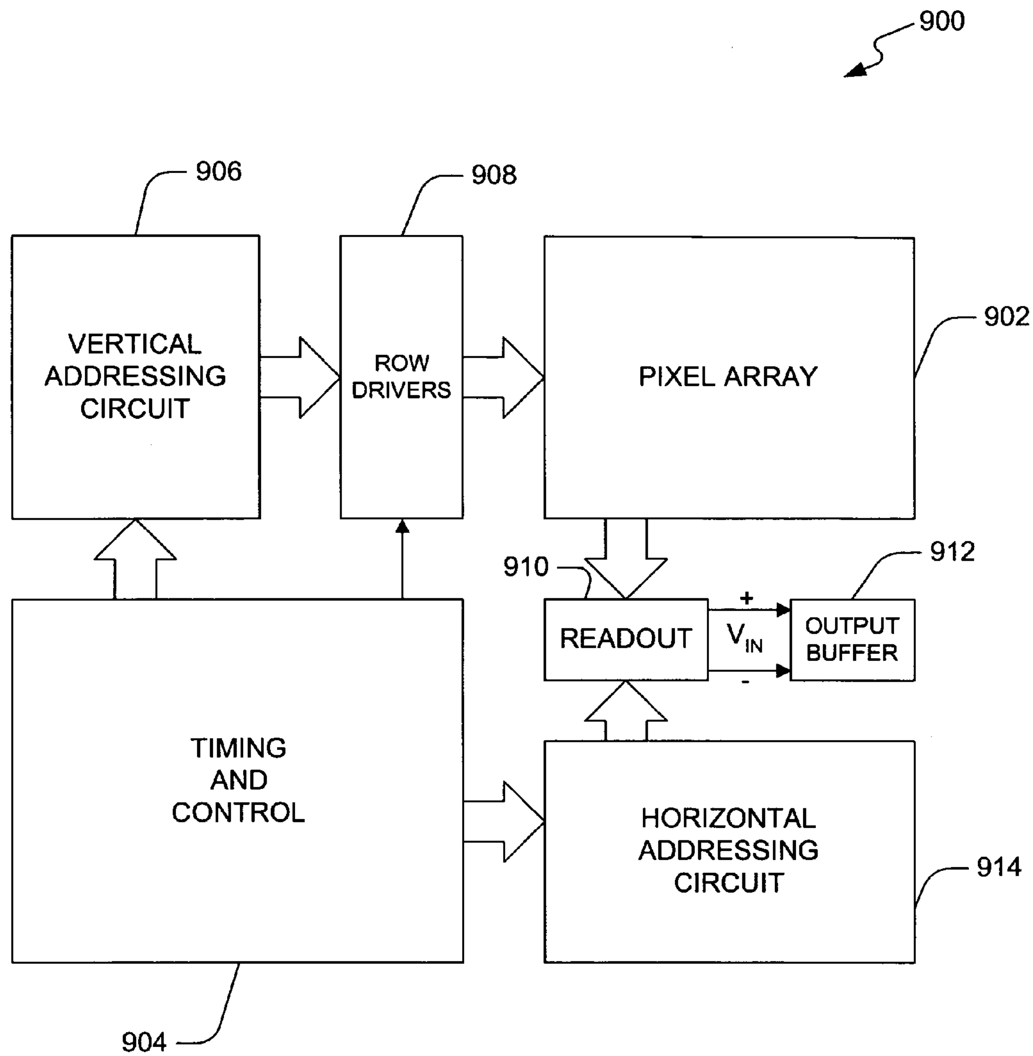
FIG. 9 shows an embodiment of a CMOS image sensor system having pixels with n-type photodiodes and p-type transistors.
Figure 3:
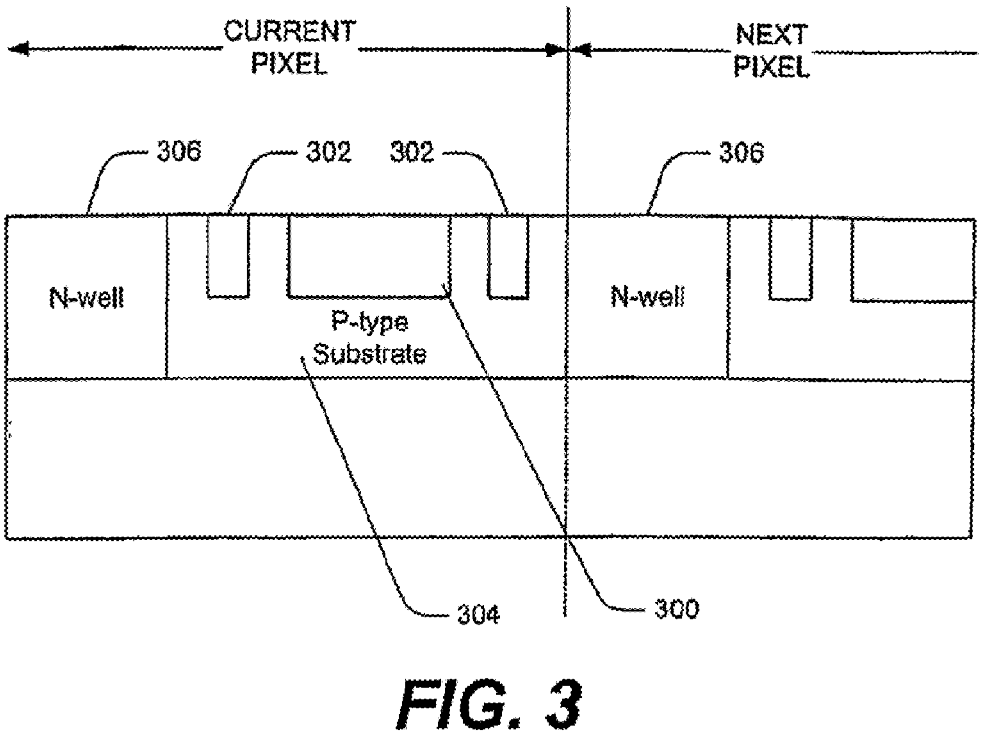
Figure 4:
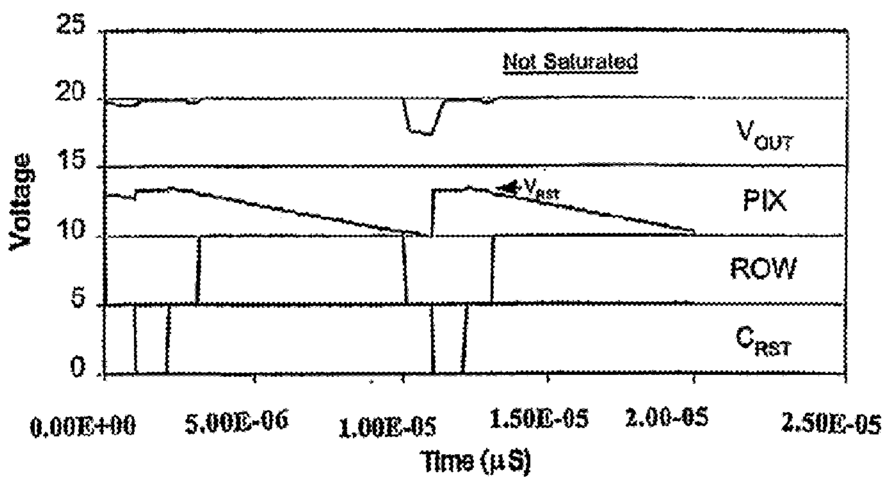

FIG. 9 shows an embodiment of a CMOS image sensor system 900. The system includes an array of active pixel sensors 902 and a controller 904. Each active pixel sensor may be implemented with p-channel MOSFET transistors and an n-type photodiode. The controller 904 provides timing and control signals to enable read out of signals stored in the pixels.

The image array 902 data is read out a row at a time using column-parallel readout architecture, as illustrated by a column readout circuit 110 in FIG. 1. The controller 904 selects a particular row of pixels in the array 902 by controlling the operation of the vertical addressing circuit 906 and row drivers 908. Charge signals stored in the selected row of pixels are provided to a readout circuit 910. The pixels read from each of the columns can be read out sequentially using a horizontal addressing circuit 914. The output of the readout circuit 910 is directed to an output stage buffer 912. The output stage buffer 912 includes a p-type source-follower MOSFET transistor similar to the source-follower 220, and a p-type load transistor 218 as shown in FIG. 2.

While specific embodiments of the invention have been illustrated and described, other embodiments and variations are possible. For example, although the transistors used in the pixel sensors have been described in terms of MOSFET transistors, other types of transistors, such as JFET or bipolar transistors, may be used in the pixel sensors.

All these are intended to be encompassed by the following claims.

What is claimed is:

1. A pixel sensor comprising:

an n-type photosensitive element for converting an optical image to an electrical signal;

a p-type source follower transistor for receiving said electrical signal at a gate thereof and for producing therefrom a pixel output signal;

a readout circuit coupled to said source follower transistor and comprising a p-type transistor; and a first reset circuit configured to provide a reset signal at said gate of said source follower transistor, where said first reset circuit includes at least one p-type transistor having a gate for receiving a first and a second control signal thereat to control a reset operation of said photosensitive element.

2. The pixel sensor of claim 1, wherein said p-type transistors are MOSFET p-type transistors.

3. The pixel sensor of claim 1, wherein said n-type photosensitive element is an n-type photodiode.

4. The pixel sensor of claim 3, wherein said n-type photodiode is formed in a square layout design.

5. The pixel sensor of claim 3, wherein said n-type photodiode is formed in a circular layout design.

6. The pixel sensor of claim 1, further comprising:

a p-type substrate in which said n-type photosensitive element is formed.

7. The pixel sensor of claim 6, further comprising:

a pair of p+ type guard rings formed in said p-type substrate, each of said pair of guard rings formed on either side of said n-type photosensitive element, said pair of guard rings adapted for connection to a ground voltage, and operating to reduce a leakage current from said n-type photosensitive element.

8. The pixel sensor of claim 6, further comprising:

an n-type well formed in said p-type substrate, said n-type well adapted for connection to a supply voltage, and operating to prevent charges from escaping the pixel sensor.

9. The pixel sensor of claim 1, further comprising:

a second reset circuit having a p-type MOSFET transistor configured to apply said second control signal to said gate of said first reset circuits said second reset circuit allowing pixel-by-pixel reset operation.

10. The pixel sensor of claim 1, wherein the p-type transistor of the readout circuit comprises a row select transistor for selectively reading out said pixel output signal.

11. The pixel sensor of claim 10, wherein said row select transistor is coupled to receive an output of said source follower transistor.

12. An image sensing device, comprising:

a p-type substrate;

an n-type photodiode formed in said p-type substrate, where said n-type photodiode operates to convert an optical image to an electrical signal;

a p-type source follower transistor for receiving said electrical signal at a gate thereof and for producing therefrom a pixel output signal;

a first reset circuit configured to provide a reset signal for said electrical signal, said first reset circuit including a p-type MOSFET transistor having a gate for receiving a first and a second control signal thereat to control a reset operation of said photodiode; and a readout circuit operating to buffer said electrical signal, said readout circuit including a p-type MOSFET transistor.

13. The device of claim 12, further comprising:

a pair of p+ type guard rings formed in said p-type substrate, each of said pair of guard rings formed on either side of said n-type photodiode, said pair of guard rings adapted for connection to a ground voltage, and operating to reduce a leakage current from said n-type photodiode.

14. The device of claim 13, further comprising:

an n-type well provided adjacent to one of said pair of p+ type guard rings, said n-type well adapted for connection to a supply voltage, and operating to prevent crosstalk between pixels in the image sensing device.

15. The device of claim 12, further comprising:

a second reset circuit having a p-type MOSFET transistor configured to apply said second control signal to said gate of said first reset circuit, said second reset circuit allowing pixel-by-pixel reset operation.

16. The device of claim 12, wherein the device is a CMOS image sensing device and said p-type transistors provide radiation hardness without any radiation protective enclosure.

17. The device of claim 12, wherein said source follower transistor is a p-type MOSFET transistor.

18. The device of claim 12, wherein the readout circuit comprises a row select transistor for selectively outputting said pixel output signal.

19. The device of claim 18, wherein said row select transistor is coupled to receive an output of said source follower transistor.

20. A CMOS image sensor system, comprising:

an array of active pixel sensors, each pixel sensor of said array including:

an n-type photosensitive element operating to convert an optical image to an electrical signal;

a p-type source follower transistor for receiving said electrical signal at a gate thereof and for producing therefrom a pixel output signal;

a pixel readout circuit, where said pixel readout circuit includes at least one p-type transistor coupled to receive an output of said source follower transistor;

a first reset circuit configured to provide a reset level for a pixel output signal, where said first reset circuit includes at least one p-type transistor having a gate for receiving a first and a second control signal thereat to control a reset operation of said photosensitive element;

a control circuit configured to provide timing and control signals to enable read out of data stored in said array of active pixel sensors; and a column readout circuit operating to receive and process said data stored in said array of active pixel sensors.

21. The CMOS image sensor of claim 20, further comprising:

a p-type substrate in which said array of pixel sensors is formed.

22. The CMOS image sensor of claim 21, each pixel sensor further comprising:

a pair of p+ type guard rings formed in said p-type substrate, each of said pair of guard rings formed on either side of said n-type photosensitive element, said pair of guard rings adapted for connection to a ground voltage, and operating to reduce a leakage current from said n-type photosensitive element.

23. The CMOS image sensor of claim 22, each pixel sensor further comprising:

an n-type well provided adjacent to at least one of said pair of p+ type guard rings, said n-type well adapted for connection to a supply voltage, and operating to prevent crosstalk between pixels.

24. The CMOS image sensor of claim 20, each pixel sensor further comprising:

a second reset circuit having a p-type MOSFET transistor configured to apply said second control signal to said gate of said first reset circuit, said second reset circuit allowing pixel-by-pixel reset operation.

25. The CMOS image sensor of claim 20, wherein said readout circuit includes a row select transistor for selectively connecting the pixel sensor to a column line of the array.

26. The CMOS image sensor of claim 25, wherein said row select transistor is coupled to receive said output of said source follower transistor.

27. The CMOS image sensor of claim 20, wherein said p-type transistors provide radiation hardness to the array of active pixel sensors.

28. An array of pixel sensors comprising:

a plurality of pixels formed in a p-type substrate, at least one of said pixels comprising:

an n-type photodiode formed in said substrate and for generating an electrical signal in response to an applied optical image;

a p-type source follower transistor for receiving said electrical signal at a gate thereof and for producing therefrom a pixel output signal;

a first reset circuit coupled to said gate and responsive to a first reset control signal for providing a global reset value as said pixel output signal;

a second reset circuit coupled to an input of said first reset circuit and for generating a second reset control signal for operating said first reset circuit to allow a pixel-by-pixel reset;

a p-type row select transistor for selectively connecting the pixel to an associated column line of the array for readout of the pixel output signal; and a pair of p+ type guard rings formed in said p-type substrate, each of said pair of guard rings located on either side of said n-type photodiode.

29. The array of pixel sensors of claim 28, said at least one pixel further comprising an n-type well located adjacent at least one of said pair of p+ type guard rings in said p-type substrate.

30. The array of pixel sensors of claim 28, wherein said p-type transistors provide said at least one pixel with radiation hardness, without a radiation protective enclosure.

31. An array of pixel sensors comprising a plurality of pixel sensors arraigned in a plurality of rows and columns, each pixel sensor comprising:

an n-type photosensitive element for converting an optical image to an electrical signal;

a p-type source follower transistor for receiving said electrical signal at a gate thereof and for producing therefrom a pixel output signal;

a first reset transistor having a first reset gate configured to receive a first reset control signal for performing a reset operation for said photosensitive element, said first reset control signal being commonly applied to a row of pixels; and a second reset transistor having a second reset gate configured to receive a second reset control signal for performing a reset operation for the photosensitive element as an individual pixel reset.

32. The pixel array of claim 31, wherein the first and second reset transistors are p-type MOSFET transistors.

33. The pixel array of claim 31, each pixel cell further comprising:

a pair of p+ type guard rings formed in said p-type substrate, each of said pair of guard rings formed on either side of said n-type photosensitive element, said pair of guard rings adapted for connection to a ground voltage, and operating to reduce a leakage current from said n-type photosensitive element.

* * * * *

UNITED STATES PATENT AND TRADEMARK OFFICE
CERTIFICATE OF CORRECTION

PATENT NO. : 7,012,645 B1
APPLICATION NO. : 09/648403
DATED : March 14, 2006
INVENTOR(S) : Richard H. Tsai It is certified that error appears in the above-identified patent and that said Letters Patent is hereby corrected as shown below:

On Title page item 56

In the U.S. Patent Documents portion of the References Cited section, the following patents are added:

| | | |
|---|---|---|
| 5,965,871 | 10/1999 | Zhou et al. |
| 6,111,245 | 8/2000 | Wu et al. |
| 6,133,563 | 10/2000 | Clark et al. |
| 6,369,853 | 4/2002 | Merrill et al. |
| 6,380,571 | 4/2002 | Kalnitsky et al. |
| 6,587,142 | 7/2003 | Kozlowski et al. |

Figure 4:
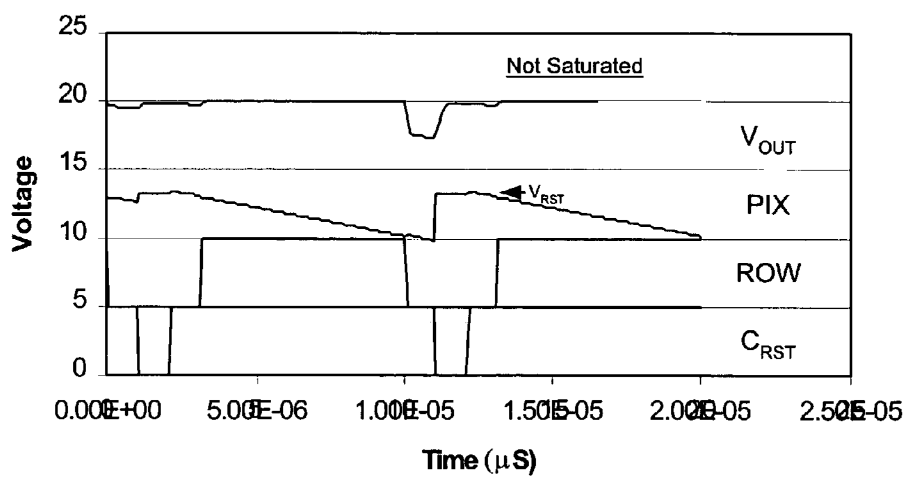
FIG. 4 shows a simulation result with an active pixel sensor design.

In the Drawings, replace Figure 4 in the printed patent with the attached replacement drawing. fig 4

Signed and Sealed this

Twenty-seventh Day of February, 2007

JON W. DUDAS
*Director of the United States Patent and Trademark Office*